United States Patent [19]
Chatterjee et al.

[11] Patent Number: 4,673,962
[45] Date of Patent: Jun. 16, 1987

[54] VERTICAL DRAM CELL AND METHOD

[75] Inventors: Pallab K. Chatterjee, Richardson; Ashwin H. Shah, Dallas, both of Tex.

[73] Assignee: Texas Instruments Incorporated, Dallas, Tex.

[21] Appl. No.: 714,589

[22] Filed: Mar. 21, 1985

[51] Int. Cl.⁴ .................. H01L 29/78; H01L 27/02; H01L 29/06

[52] U.S. Cl. .................. 357/23.6; 357/41; 357/45; 357/51; 357/55; 357/59; 365/149

[58] Field of Search .................. 357/23.6, 41, 45, 55, 357/51, 59; 365/149

[56] References Cited

U.S. PATENT DOCUMENTS 4,199,772  4/1980  Natori et al. .................. 357/23.6

FOREIGN PATENT DOCUMENTS 0108390   5/1984  European Pat. Off. .......... 357/23.6
59-103373 1/1984  Japan ........................... 357/55
59-19366  1/1984  Japan ........................... 357/23.6
59-141262 8/1984  Japan ........................... 357/59

OTHER PUBLICATIONS

D. M. Kenney, "V-Groove Dynamic Memory Cell", IBM Technical Disclosure Bulletin, vol. 23 (1980), pp. 967-969.
T. S. Chang et al., "Fabrication of V-MOS or U-MOS Random Access Memory Cells with Self-Aligned Word Line", IBM Technical Disclosure Bulletin, vol. 22 (1979), pp. 2768-2771.

Primary Examiner—J. Carroll
Attorney, Agent, or Firm—Douglas A. Sorensen; James T. Comfort; Melvin Sharp

[57] ABSTRACT

DRAM cells and arrays of cells on a semiconductor substrate, together with methods of fabrication, are disclosed wherein the cells are formed in pairs or quartets by excavating a trench or two trenches through the cell elements to split an original cell into two or four cells during the fabrication. The cells include vertical field effect transistors and capacitors along the trench sidewalls with word lines and bit lines crossing over the cells.

11 Claims, 17 Drawing Figures

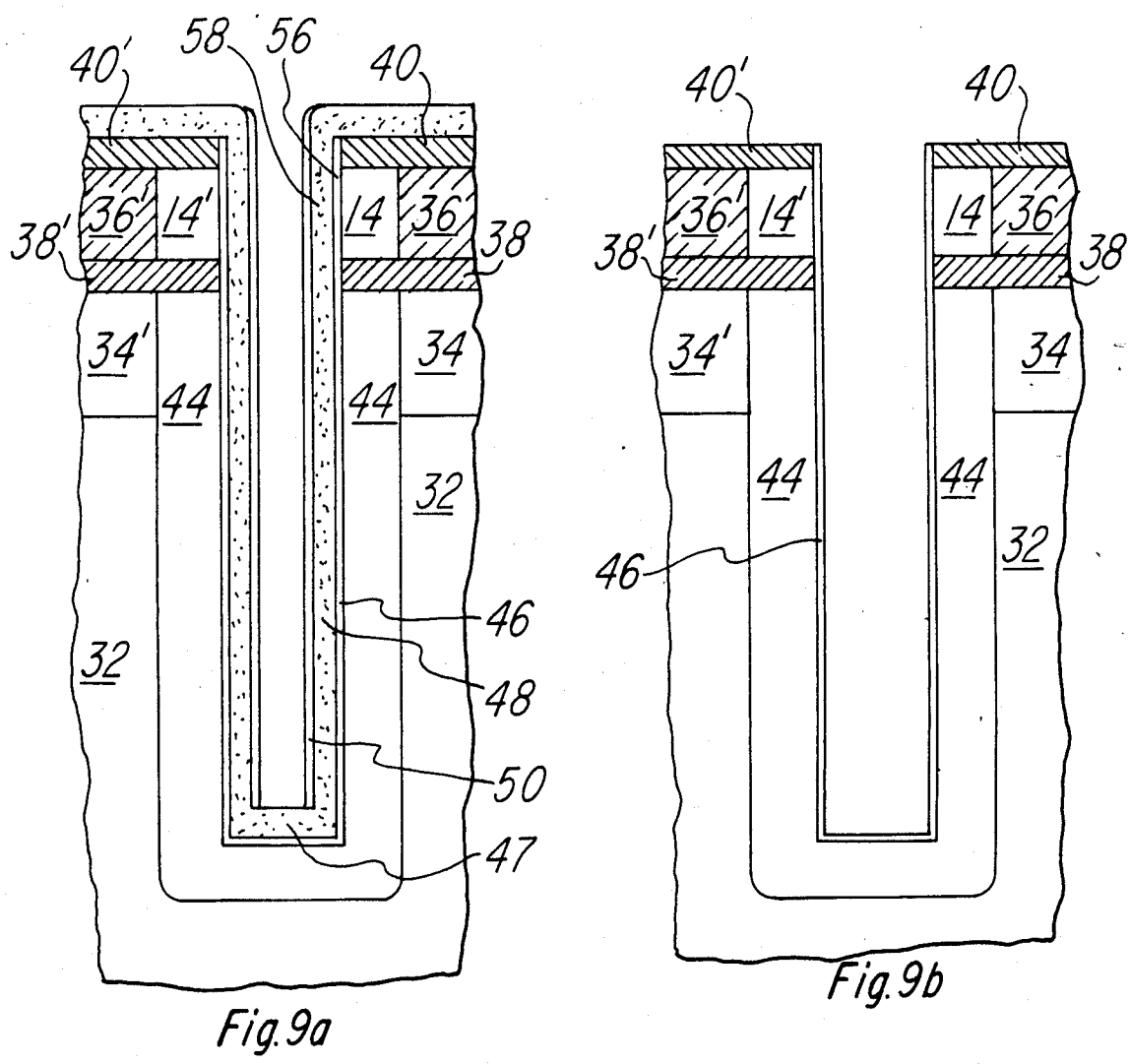

VERTICAL DRAM CELL AND METHOD

BACKGROUND

The present invention relates to semiconductor devices, and, more particularly, to dynamic random access memories.

The development of large monolithic dynamic random access memories (dRAMs) has run into many problems, and one of the most important of these problems is that of shrinking the dRAM cell size without increasing the soft-error rate in order to pack more cells on a chip. Large dRAMs are silicon based and each cell typically includes a single MOS field effect transistor with its source connected to a storage capacitor, its drain connected to a bit line, and its gate connected to a word line; the cell operates by storing a charge on the capacitor for a logic 1 and not storing any charge for a logic 0. Traditionally the cell capacitor has been formed by an inversion layer separated from an overlying electrode by a thin oxide layer and from the substrate by a depletion layer. However, to maintain stable circuit operation the capacitance must be large enough to yield a sufficient signal to noise ratio, and this leads to large substrate area devoted to the capacitor. Further, such a MOS capacitor is vulnerable to charges generated in the substrate by alpha particles (a 5 MeV alpha particle can produce more than 200 femtocoulombs of hazardous electrons), noise injected from the substrate, pn junction leakage over the entire area of the capacitor, and subthreshold leakage of the cell transistor. A typical stored charge in a dRAM cell is 250 fC. For a five volt power supply this requires a storage capacitor of 50 fF; and with a storage oxide thickness of 150 A, a capacitor area of about 20 square microns is needed. This imposes a lower limit on the cell size if conventional two dimensional technology is used.

One approach to solve these problems appears in Jolly et al, A Dynamic RAM Cell in Recrystallized Polysilicon, 4 IEEE Elec. Dev. Lett. 8 (1983) and forms all basic elements of the cell, including both the access transistor and the charge storage capacitor, in a layer of beam recrystallized polysilicon deposited on an oxide layer on a silicon substrate. The bit line is contained in the recrystallized polysilicon layer, and turning on the transistor causes charge to flow into the storage region, which is composed of heavily doped, recrystallized polysilicon surrounded on the top, bottom, and three sides by thermally grown oxide. The storage capability is about twice that of a conventional capacitor of the same storage area since ground electrodes both above and below are separated from the storage region in the recrystallized polysilicon by capacitor insulator oxides. In addition, the lower oxide isolates the storage region from any charge injected into the substrate either from surrounding circuitry or by alpha particles or other radiation generating soft errors. Further, thick oxide under the bit line and complete sidewall oxide isolation reduce the bit-line capacitance. However, even doubling the capacitance over the traditional design fails to sufficiently shrink the area occupied by the cell capacitor. Further, beam recrystallization disturbs underlying structures and is not a simple, established process.

A second approach to shrinking dRAM cell size relies on a capacitor with plates extending into the substrate. This capacitor, called a corrugated capacitor, is described in H. Sunami et al, A Corrugated Capacitor Cell (CCC) for Megabit Dynamic MOS Memories, IEEE IEDM Tech Digest 806 (1982); H. Sunami et al, A Corrugated Capacitor Cell (CCC) for Megabit Dynamic MOS Memories, 4 IEEE Elec. Dev. Lett. 90 (1983); and K. Itoh et al, An Experimental 1Mb DRAM with On-Chip Voltage Limiter, 1984 IEEE ISSCC Digest of Tech Papers 282. The corrugated capacitor extends about 2.5 microns into the silicon substrate. Fabrication proceeds as follows: Trenches are formed by ordinary reactive sputter etching with CCl4 gas using a CVC silicon dioxide film mask; a wet etch cleans up any dry etching damage and contaminations. After trench formation, a triple storage layer of silicon dioxide/silicon nitride/silicon dioxide is formed on the trench walls. Lastly, the trench is filled with LPCVD polysilicon. Use of the corrugated capacitor assertedly yields more than seven times the capacitance of the conventional cell, with a three micron by seven micron cell having a 60 fF storage capacitance.

A third approach to shrink the area occupied by the cell capacitor is similar to the approach described in the preceding paragraph and forms the capacitor in a trench. For example, E. Arai, Submicron MOS VLSI Process Technologies, IEEE IEDM Tech Digest 19 (1983); K. Minegishi et al, A Submicron CMOS Megabit Dynamic RAM Technology Using Doped Face Trench Capacitor Cell, IEEE IEDM Tech Digest 319 (1983); and T. Morie et al, Depletion Trench Capacitor Technology for Megabit Level MOS dRAM, 4 IEEE Elec. Dev. Lett. 411 (1983) all describe a cell with a traditional design except for the capacitor which has been changed from plates parallel to the substrate to plates on the walls of a trench in the substrate. Such a trench capacitor permits large capacitance per unit area of substrate by simply using a deep trench. The capacitors described in these articles were fabricated as follows: Starting with (100) oriented, p-type, 4–5 ohm-cm resistivity silicon substrates, trench patterns with 0.4–1.0 micron width were formed by electron-beam direct writing. Trenches of 1–3 micron depth were then excavated by reactive ion etching with $CBrF_3$ at a pressure of about 14 mTorr; the trench surfaces were cleared of RIE damage by an etch in a mixture of nitric, acetic, and hydrofluoric acids. PSG was then deposited by CVD using a $PH_3/SiH_4/O_2$ gas system, the phosphorus diffused into the trench surface layers, and the PSG etched away by hydofluoric acid. $SiO_2$ of 150–500 A was grown in dry $O_2$ or CVD $Si_3N_4$ was deposited 500 A thick on the trench walls. Lastly, the trenches were filled with LPCVD polysilicon. The capacitance per unit area of trench sidewall was comparable to the capacitance per unit area of a traditional capacitor; consequently, deep trench capacitors can shrink cell substrate area by enhancing the storage capacitor area per unit substrate area. However, the cell transistor in these trench capacitor cells is formed in the bulk substrate adjacent to the capacitor and is not isolated as in the first approach.

The use of trenches for isolation is also well known and has been extensively studied; for example, R. Rung et al, Deep Trench Isolated CMOS Devices, IEEE IEDM Tech Digest 237 (1982); K. Cham et al, A Study of the Trench Inversion Problem in the Trench CMOS Technology, 4 IEEE Elec. Dev. Lett. 303 (1983); A. Hayasaka et al, U-Groove Isolation Technique for High Speed Bipolar VLSI's, IEEE IEDM Tech Digest 62 (1982); H. Goto et al, An Isolation Technology for High Performance Bipolar Memories—IOP-II, IEEE IEDM Tech Digest 58 (1982); T. Yamaguchi et al, High-Speed Latchup-Free 0.5-μm-Channel CMOS Using Self-Aligned TiSi$_2$ and Deep-Trench Isolation Technologies, IEEE IEDM Tech Digest 522 (1983); S. Kohyama et al, Directions in CMOS Technology, IEEE IEDM Tech Digest 151 (1983); and K. Cham et al, Characterization and Modeling of the Trench Surface Inversion Problem for the Trench Isolated CMOS Technology, IEEE IEDM Tech Digest 23 (1983). These isolation trenches are formed in a manner similar to that described for the trench and corrugated capacitors; namely, patterning (typically with oxide mask), RIE with $CBrF_3$, $CCl_4$, $Cl_2-H_2$, $CCl_4-O_2$, etc. excavation, thermal oxidation (plus LPCVD nitride) of the sidewalls, and filling with polysilicon.

However, the beam recrystallized cell occupies too much substrate area and the trench capacitor cells fail to isolate the transistor and capacitor storage plate from the substrate. And all of these cells do not minimize the substrate area occupied.

SUMMARY OF THE INVENTION

The present invention provides a one-transistor one-capacitor dRAM cell structure, array of cells and method of fabrication in which the cell transistor is formed on a portion of a sidewall of a substrate trench containing the cell capacitor on the same sidewall. The trenches in preferred embodiments are elongated and run with the word lines or the bit lines or both, and the cells are formed at the crossings of the bit lines over the word lines. The word lines or bit lines or both are isolated from each other alternatively by trenches and by insulation. The preferred embodiment methods of fabrication of the cells include forming a cell element (such as word line) and then excavating a trench that splits the elements into parts for two or more cells.

BRIEF DESCRIPTION OF THE DRAWINGS

FIGS. 9A-B are cross sectional elevation views of steps following those of FIGS. 8A-B;

DESCRIPTION OF THE PREFERRED EMBODIMENTS

Figure 1:
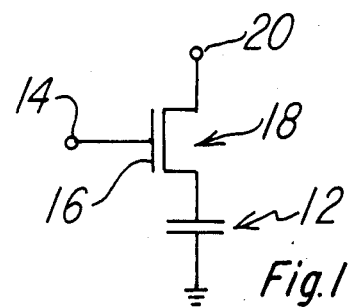
FIG. 1 is an illustrative schematic equivalent circuit for the preferred embodiment cells.

FIG. 1 is a schematic equivalent circuit of the preferred embodiment dRAM cells and illustrates the one transistor and one capacitor structure. The cells operate as follows: capacitor 12 stores charge to represent a bit of information (for example, no stored charge could represent a logic 0 and the stored charge corresponding to a potential of five volts across capacitor 12 could represent a logic 1). The bit of information is accessed (to read or to write a new bit) by applying a voltage on word line 14 connected to gate 16 to turn on transistor 18; a turned on transistor 18 connects capacitor 12 to bit line 20 for the read or write operations. Leakage currents and other sources of decay of the charge stored in capacitor 12 necessitate periodic refreshing of the charge and thus the name dynamic RAM (dRAM).

Figure 2:
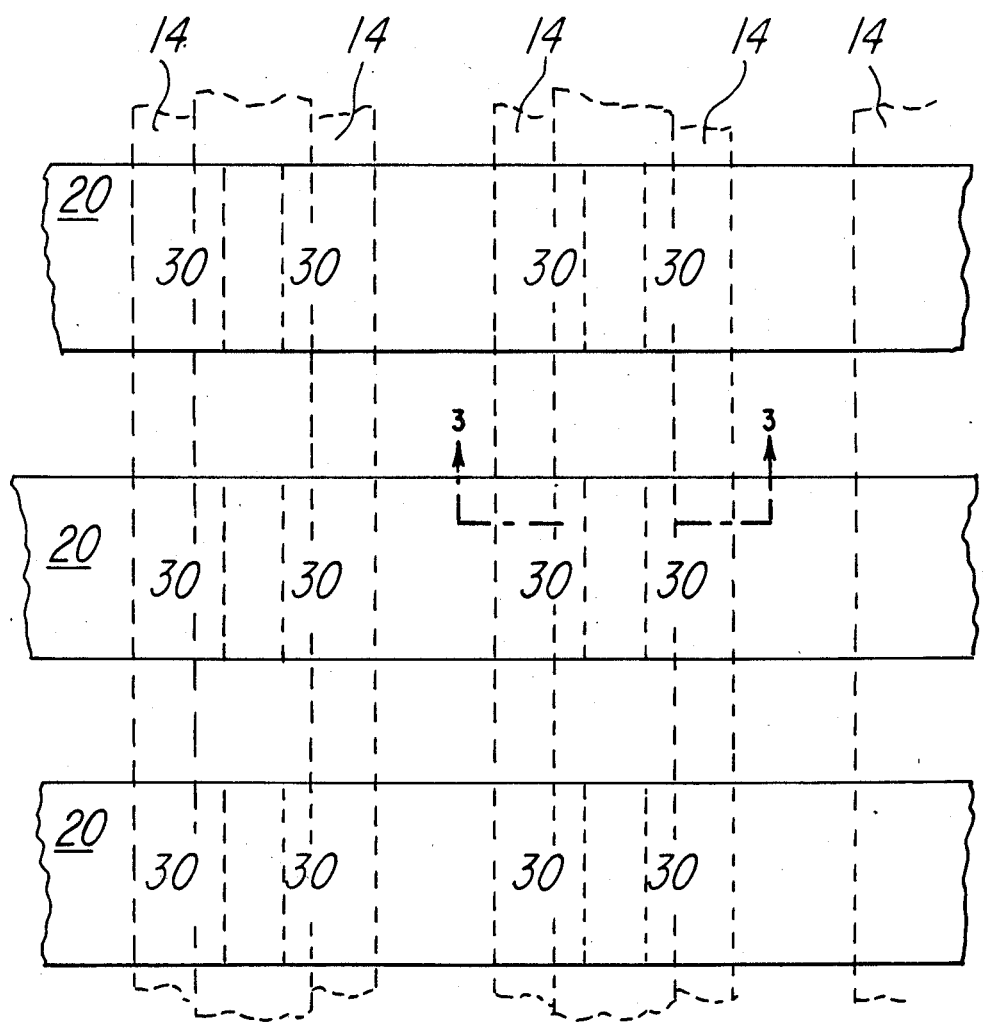
FIG. 2 is a plan view of a first preferred embodiment array of first preferred embodiment cells.
Figure 3:
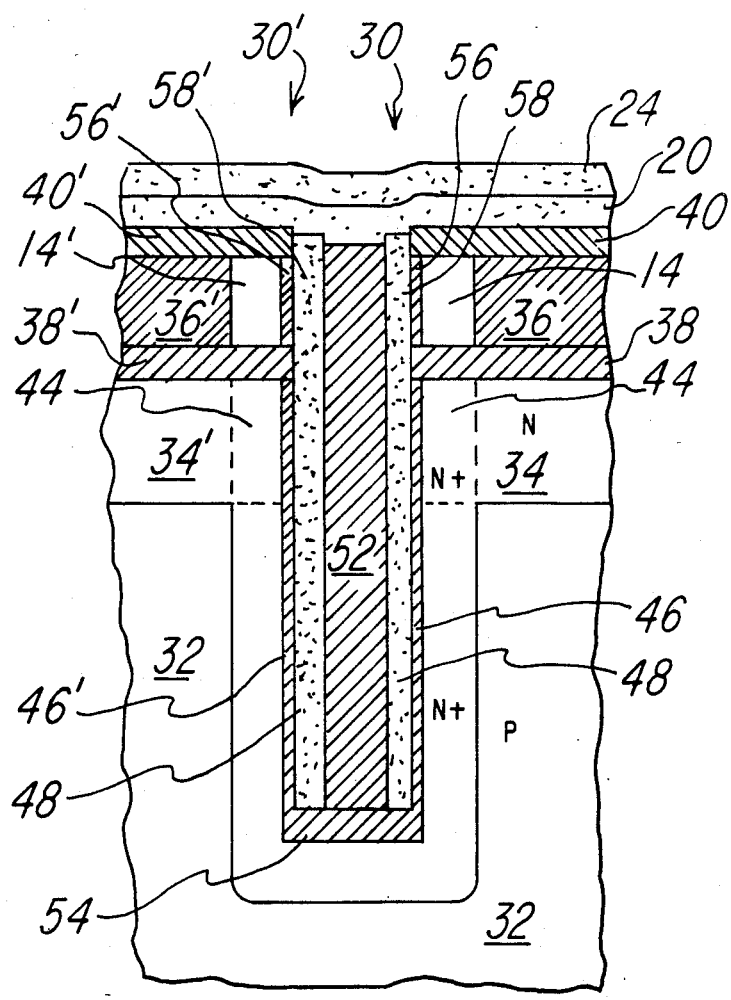
FIG. 3 is a schematic cross sectional elevation view of a first preferred embodiment pair of cells.
Figure 4A:
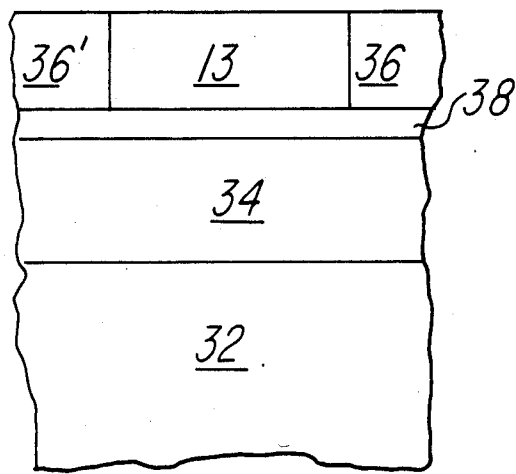
FIGS. 4A-B are cross sectional and plan views of the first steps in a first preferred embodiment method of fabrication of first preferred embodiment cells and array.
Figure 4B:
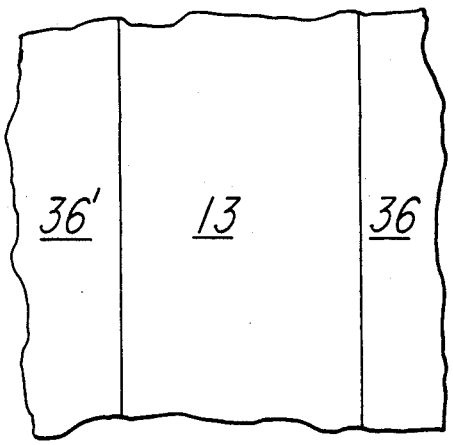
Figure 5A:
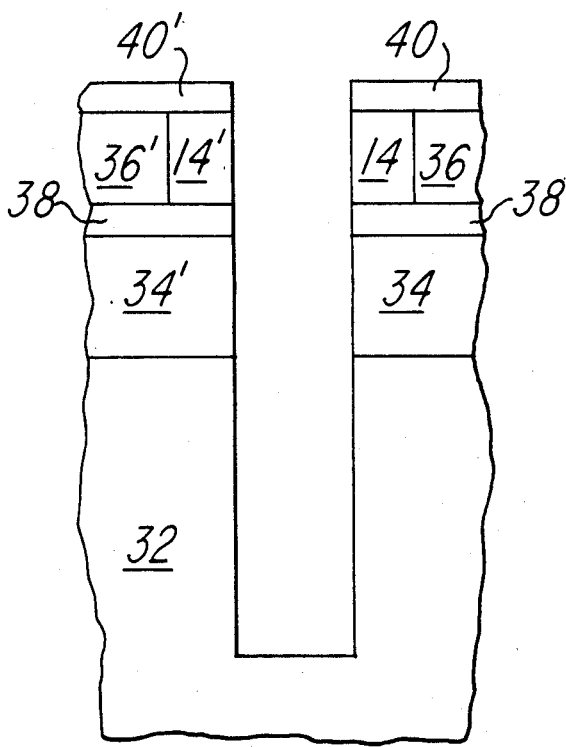
FIGS. 5A-B are cross sectional and plan views of steps following those of FIGS. 4A-B.
Figure 5B:
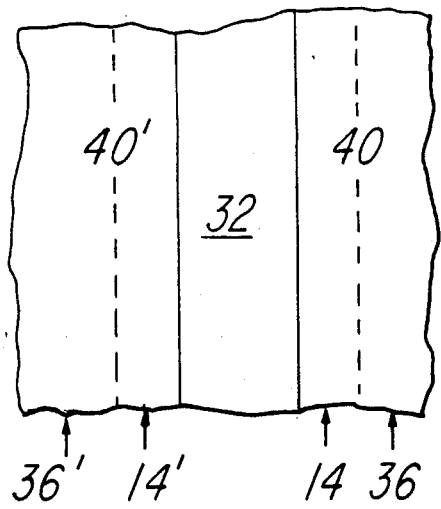
Figure 6:
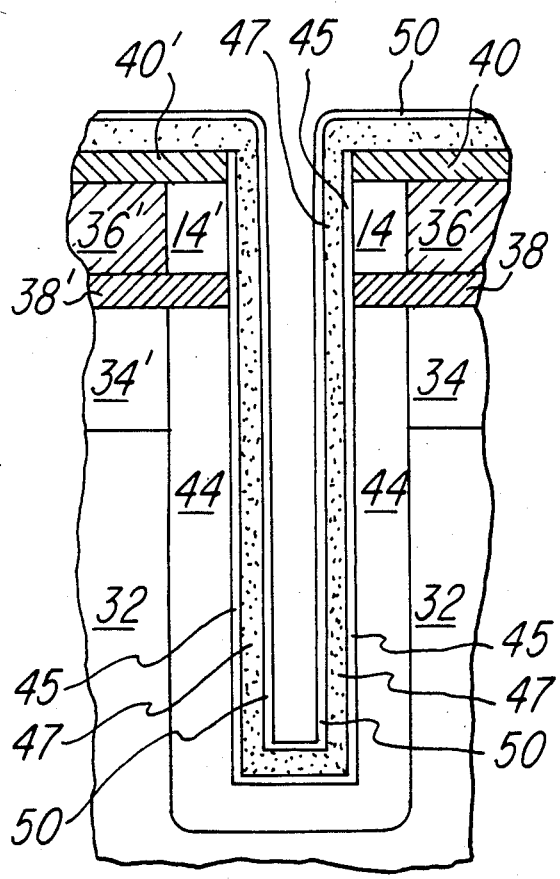
FIG. 6 is a schematic cross sectional view of steps following those of FIGS. 5A-B.
Figure 7:
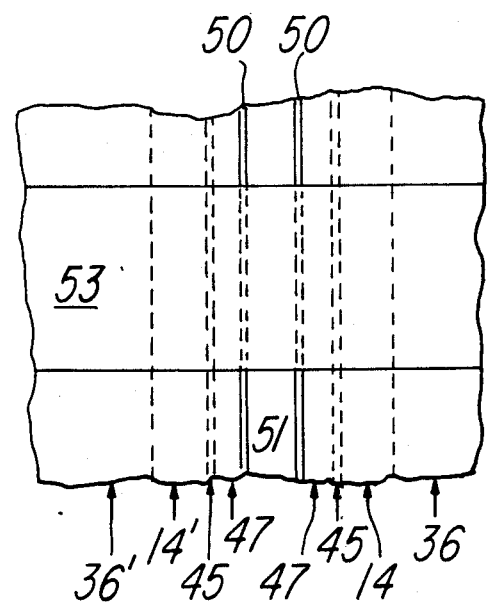
FIG. 7 is a plan view of steps following those of FIG. 6.

FIG. 2 is a plan view showing a portion of a first preferred embodiment array of first preferred embodiment dRAM cells and includes bit lines 20 crossing word lines 14 with the cells, generally denoted 30, located a the crossings. Note that word lines 14 pass under bit lines 20; this is also illustrated in FIG. 3. Cells 30 extend down into the substrate along the sidewalls of trenches which run vertically in FIG. 2; this yields a stacking of the cell transistor 18 over the cell capacitor 12 to maximize the cell density in the plane of the array. If bit lines 20 are 1.5 microns wide with 1.0 micron spacing between bit lines, and if word lines 14 are 0.5 micron thick into the sidewalls of trenches 1.0 micron wide and with 1.0 micron spacing between word lines, then the area occupied per cell is 3.75 square microns (note that there are two cells at each crossing of a bit line over a trench: one on each trench sidewall).

FIG. 3 is a cross sectional view of two cells 30 taken along line 3—3 of FIG. 2. To distinguish between these two cells, the cell in the left hand portion of FIG. 3 will have primes attached to the reference numerals of the elements not common with the cell in the right hand portion, and the discussion will be in terms of the right hand cell. Cell 30 is formed in p silicon substrate 32 with n tank 34 and includes field oxide 36, oxide layer 38, nitride layer 40, n polysilicon word line 14, polysilicon bit line 20, silicide bit line strap 24, n+ capacitor plate region 44, capacitor insulator oxide 46, polysilicon capacitor plate 48, isolation oxide 50, fill oxide 52, polysilicon transistor channel 58, and gate oxide 56. Recall from FIG. 2 that the capacitor plate 48 only extends the width of bit line 20 in the direction perpendicular to the plane of FIG. 3, but that the trench extends across the array of cells and so fill oxide 50 extends from sidewall to sidewall of the trench between the bit lines 20.

In cell 30 capacitor 12 is formed with the plates being polysilicon 48 and that portion of region 44 opposite polysilicon 48; and the insulator is oxide 46. Note that the charge is stored in polysilicon 48 and thus is isolated from substrate 32 by oxide 46. For a trench 10.0 microns deep the plate area of capacitor 12 is about 12.75 square microns if channel 58, bit line 20, and nitride 38 take up about 1.5 microns of the trench depth and if bit line 20 is 1.5 microns wide.

In cell 30 transistor 18 is a thin polysilicon field effect transistor formed with its source being polysilicon 48, drain being bit line 20, channel being polysilicon channel 58, gate being word line 14, and gate insulator being gate oxide 56. Thus with the dimensions given in the foregoing discussion, transistor 18 would have a channel length of about 1.0 micron and a channel width of 1.5 microns. For thin transistor characteristics channel polysilicon 58 is taken to be 1,500 A thick for a doping level of 1E16 and a gate voltage of 5 volts.

The dimensions and material characteristics of cell 30 are best understood in connection with the following description of a first preferred embodiment method of fabrication which is illustrated in sequential cross sectional and plan views in FIGS. 4–10.

(a) (100) oriented p silicon substrate 32 of resistivity 5–10 ohm-cm with n tank 34 of resistivity 2–3 ohm-cm and 1 micron thickness has oxide layer 38 grown to a thickness of 2,000 A. Note that the n tank may be part of a CMOS structure in areas of the substrate 32 away from cell 30. Next a 1.0 micron layer of n+ polysilicon is deposited by LPCVD and patterned and etched to form lines 13 with a width of 2.0 microns and a spacing of 1.0 microns between lines. Oxide 36/36' is deposited on polysilicon 13/oxide 38 to a thickness of 2 microns and planarized, such as by spin on resist and plasma etched with a $CF_4$-$O_2$ mixture that etches oxide and resist at comparable rates, down to expose polysilicon 13 with a thickness of 1.0 micron; see FIG. 4A for a cross sectional elevation view and FIG. 4B for a plan view.

(b) A 1,000 A thick layer of nitride 40 is deposited by LPCVD on oxide 36/polysilicon 13, and nitride 40 is patterned and etched to form 1.0 micron wide openings over the centers of polysilicon lines 13. Nitride 40 is then used as a mask for RIE with $CCl_4$ to excavate trenches 10.0 microns deep; these trenches split each polysilicon line 13 into two word lines 14 and 14'; see FIG. 5A for a cross sectional elevation view and FIG. 5B for a plan view.

(c) The sidewalls and bottom of the trenches are now doped n+ by diffusion of phosphorus from gaseous $POCl_3$; this froms n+ region 44. Next, oxide 45 is grown by thermal oxidation to a thickness of 200 A. After isolation of the cells along the trenches, oxide 45 will serve as gate oxide 56 for transistor 18 and plate insulator 46 for capacitor 12. 2,000 A of p polysilicon 47 is then conformally deposited by LPCVD; after further processing this polysilicon 47 will serve as channel 58, capacitor plate 48, and connection to bit line 20. Polysilicon 47 is then covered with 500 A of nitride 50 by conformal LPCVD. See FIG. 6 for a cross sectional elevation view.

(d) 3,000 A of conformal oxide 51 is deposited by LPCVD, this is sufficient to fill the trenches. Oxide 51 is then etched back to just remove all oxide 51 except that in the trenches; such etch back may be by a plasma etch with $SiF_4$ which may be effectively stopped on nitride 50 on the horizontal with end point detection. After the etch back of oxide 51, photoresist 53 is spun on and patterned to define bit lines 20. See FIG. 7 for a plan view.

Figures 8A, 8B:
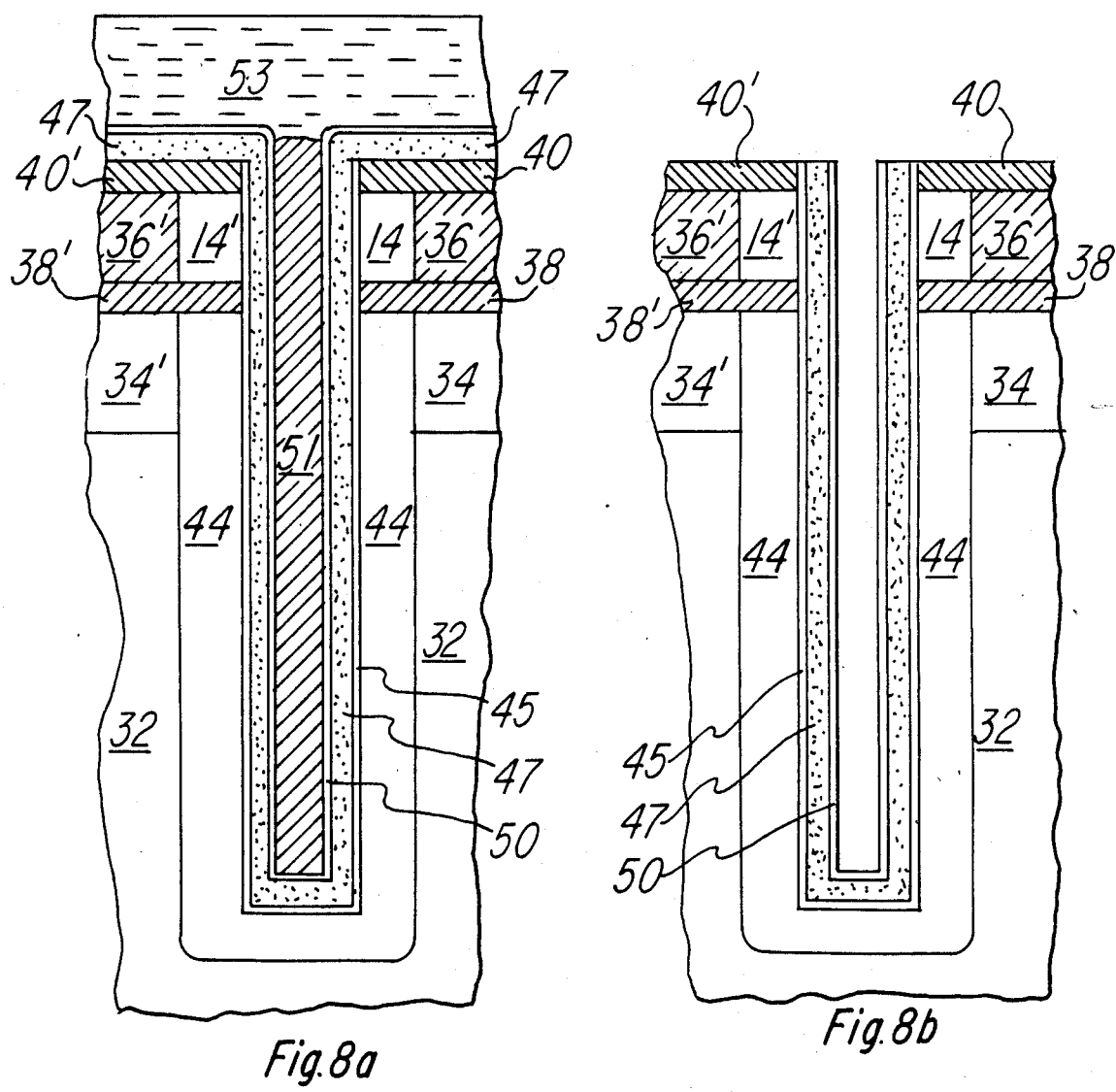
FIGS. 8A-B are cross sectional elevation views of steps following those of FIG. 7.
Figure 10A:
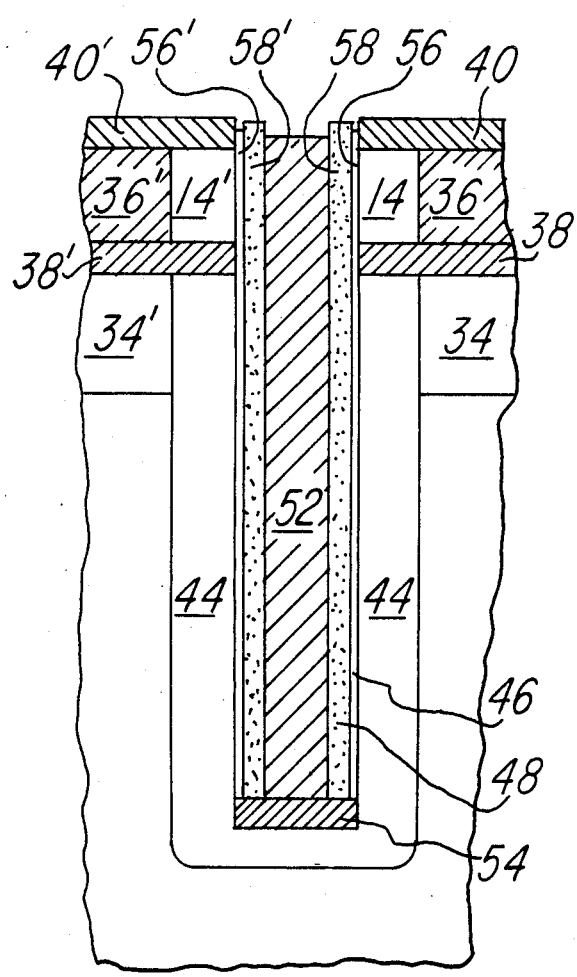
FIGS. 10A-B are cross sectional elevation views of steps following those of FIGS. 9A-B.
Figure 10B:
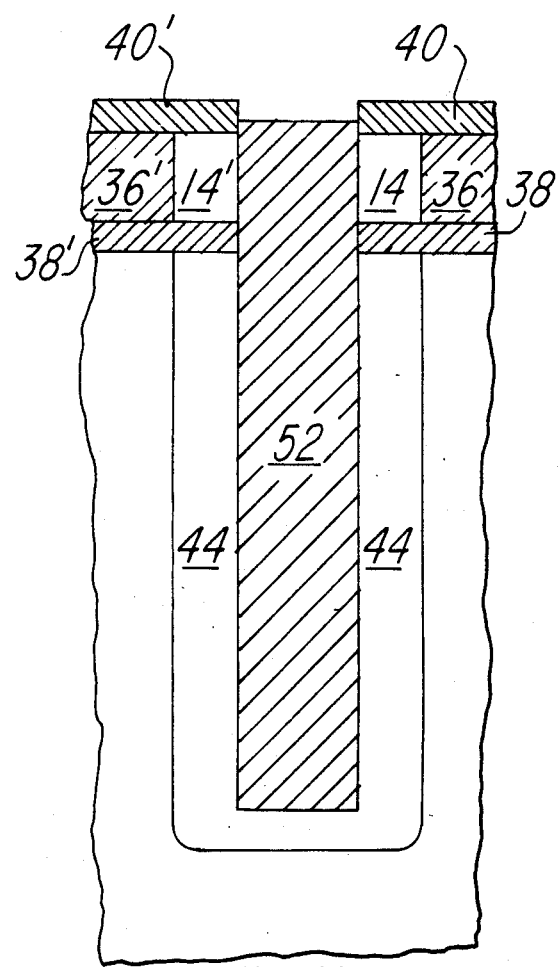

(e) The horizontal portions of nitride 50 and polysilicon 47 are etched away using resist 53 as a mask with anisotropic etches such as plasma etch nitride 50 with $CF_4$-$O_2$-$CF_3Br$ and polysilicon 47 with $CCl_4$. These are the first steps in separating the cells along the trenches. Next, oxide 51 in the trench is aniostropically etched with plasma $SiF_4$, again resist 53 is the mask that preserves oxide 51 between pairs of cells 30 to be formed. FIGS. 8A and 8B are cross sectional elevations perpendicular to the trenches; FIG. 8A is a section along resist 53 and FIG. 8B is a section parallel to the section of FIG. 8A but between successive lines of resist 53.

(f) Still using resist 53 as a mask, nitride 50 and then polysilicon 47 are isotropically etched away in that part of the trenches not under resist 53; of course, some slight loss of polysilicon 47 under resist 53 occurs due to the isotropic character of the etch. See FIG. 9B for the cross sectional elevation corresponding to FIG. 8B. At last resist 53 is ashed and oxide 51 etched followed by an anisotropic etch of nitride 50; see FIG. 9A corresponding to the cross section of FIG. 8A. Note that nitride 50 only remains as vertical filaments where cells 30 are to be formed, and thus FIG. 9A uses reference numbers 46 for the plate insulation, 48 for the plate, 56 for the gate oxide, and 58 for the transistor channel.

(g) Polysilicon 47 is oxidized to form oxide region 54 at the bottom of the trenches and an oxide version of bit lines 20 on the horizontal; note that polysilicon 48 and 58 are protected by the filaments of nitride 50. Oxide region 54 isolates cell 30 on the right hand sidewall in the elevation Figures from cell 30' on the left hand sidewall. Next, the filaments of nitride 50 are stripped and the trenches filled with a 6,000 A thick conformal LPCVD deposition of oxide 52. Oxide 52 plus the oxide version of bit lines 20 are planarized, such as by spun on resist, and etched back to just clear the horizontal of oxide (i.e., expose nitride 40, 40') but keep the trenches filled with oxide 52. See FIGS. 10A and 10B which correspond to the cross sections of FIGS. 9A and 9B. A slight over etch insures that polysilicon 58 and 58' are exposed.

(h) N+ polysilicon is LPCVD deposited to a thickness of 3,000 A and photolithographically patterned and etched to define bit lines 20. Lastly, silicide strap 24 is formed on bit lines 20 to complete cells 30 and 30' as shown in FIG. 3. Silicide strap 24 may be formed by deposition and patterning of titanium followed by direct reaction with the polysilicon 20 at 500 degrees C.

Figure 11:
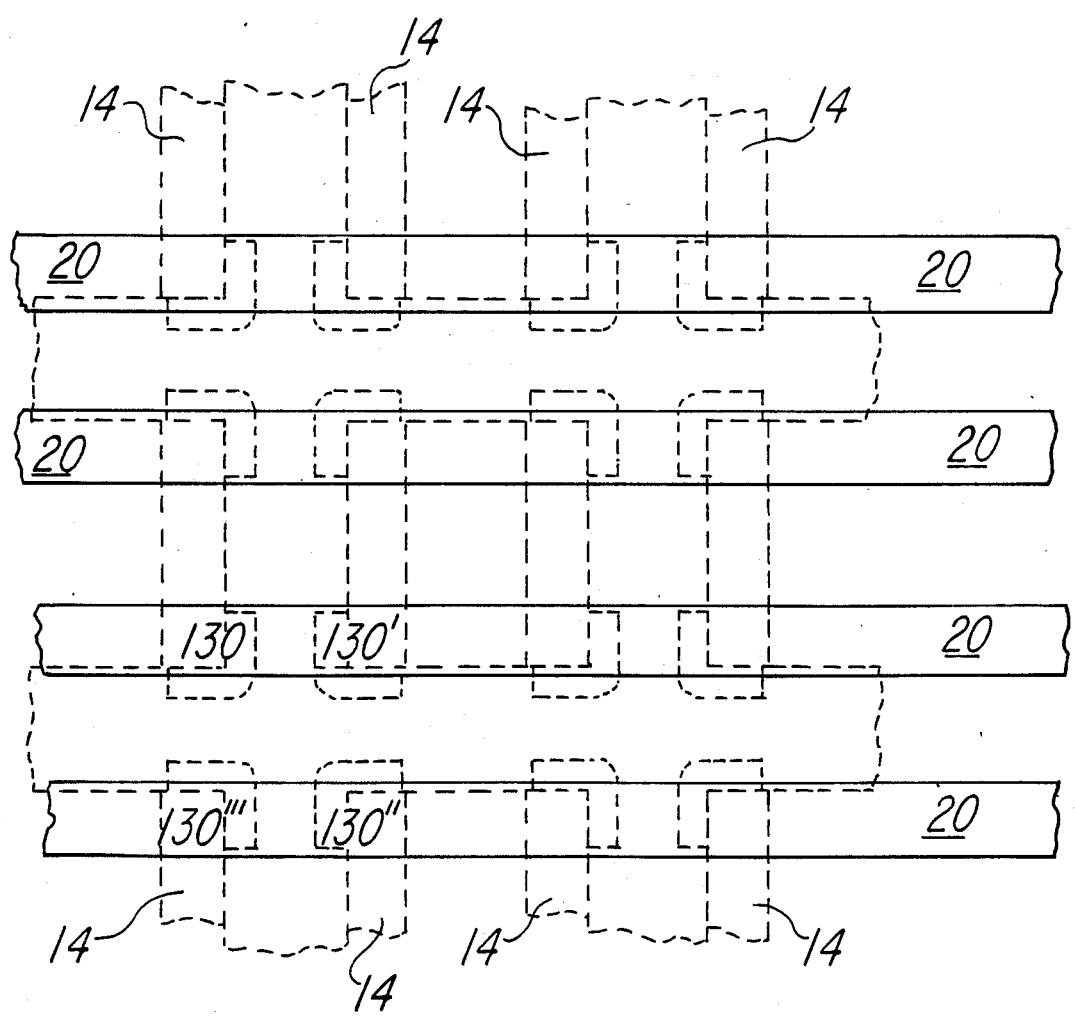
FIG. 11 is a plan view of second preferred embodiment cells and array of cells.

Section preferred embodiment cells 130 and array of cells are illustrated in plan view in FIG. 11. These second preferred embodiments have both word lines 14—14' and bit lines 20—20' split by trenches; thus FIG. 11 shows a pattern of parallel horizontal trenches crossed by parallel vertical trenches and with four cells at each of the crossings (reference numbers 130, 130', 130'', and 130'''): one cell is formed at each corner of a crossing of trenches. The second preferred embodiment method of fabrication of the second preferred embodiments follows the lines of the first preferred embodiment method except more steps are required due to the extra trench; namely, the word lines are severed by the trenches along the bit lines and must be connected over the oxide filling the bit line trenches (this connection is omitted from FIG. 11 for simplicity), and the resist is initially put down in squares over the crossings of the trenches so that the polysilicon removal isolates cells both along the word line trenches and the bit line trenches.

Figure 12:
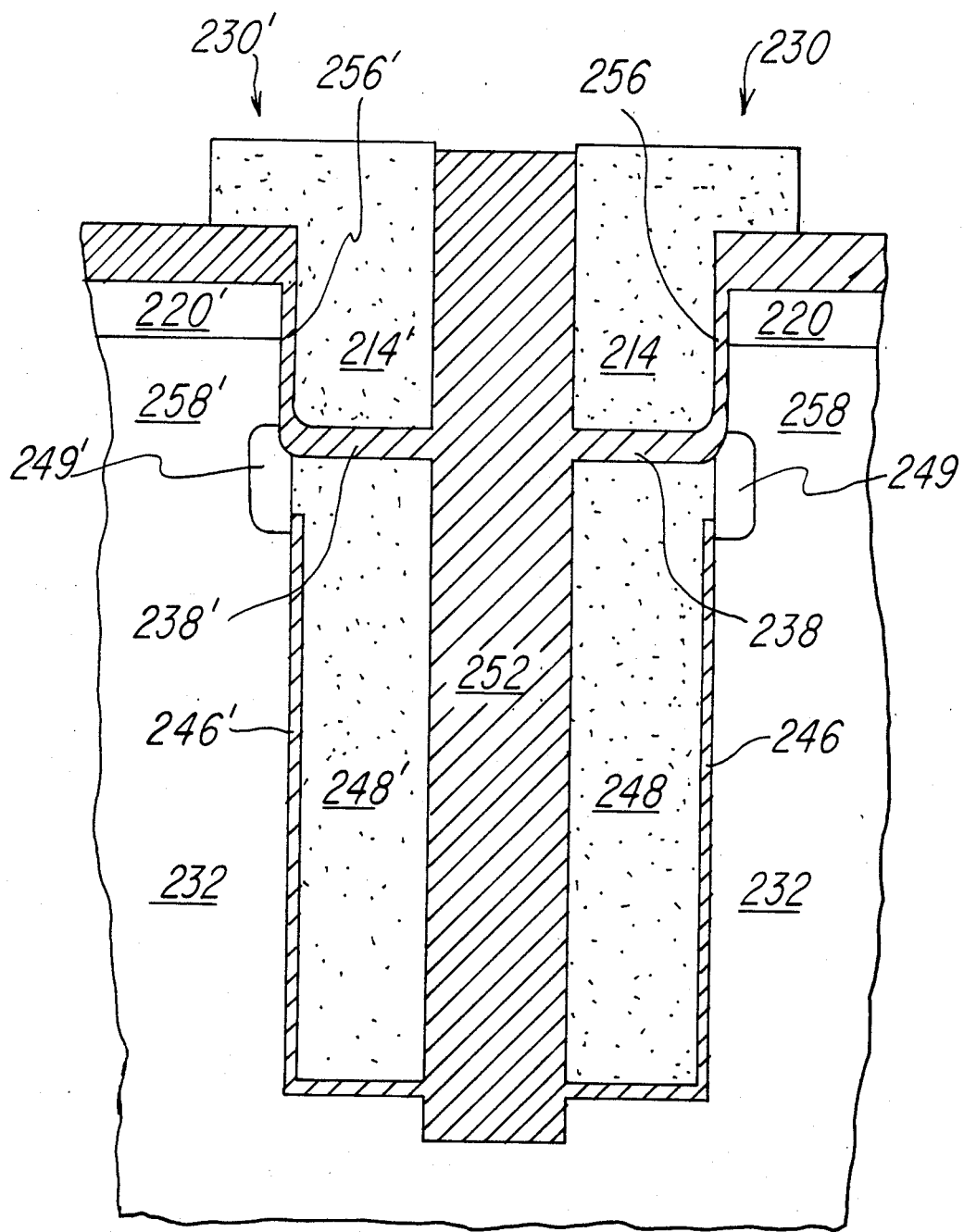
FIG. 12 is a schematic cross sectional elevation view of a pair of third preferred embodiment cells.

FIG. 12 illustrates in cell sectional elevation view the splitting by a trench of third preferred embodiment cell 230 which is a cell of different structure from that of cells 30 and 130. In particular, cell 230 has bulk (substrate) channel 258 and polysilicon gate 214; however, the preferred embodiment methods of fabrication may be adapted to fabrication of cell 230 in that the trench is excavated to split the cell into one cell on each trench sidewall, denoted as cells 230 and 230'. In FIG. 12 the elements of cells 230 and 230' have reference numbers corresponding to the the analogous elements of cells 30 and 130, and include polysilicon word lines 214, 214', bit line 220 (which has a vertical connection for crossing over the wordlines but not shown in FIG. 12 for clarity) as n+ diffusions in p substrate 232, polysilicon capacitor plates 248, 248', gate oxides 256, 256', capacitor insulators 246, 246', trench oxide 252, oxides 238, 238', and n regions (transistor sources) 249, 249'.

MODIFICATIONS AND ADVANTAGES

Various modifications of the preferred embodiment cells, arrays, and methods of fabrication are available which still fall within the scope of the invention in that such modifications either singly or in combinations do not disrupt the storage of signal charge by the capacitor nor the off/on function of the transistor for cells that have been split into two or more cells by trenches. Some modifications include the following:

The trenches may be straight (as in the preferred embodiments) or may be meandering, corrugated, or other shapes and may even vary their shapes on differing vertical levels. Also, the trenches may be short and only split one or a few cells. Similarly, the trench sidewalls need not be vertical, rather any geometry amenable to processing should work, such as bulging, tapered, and sloped sidewall. In addition to the various shapes and sidewall configurations of the trenches, the crossings of the trenches may be varied so that, for example, the trenches split the word lines in a first region of the array, split the bit lines in a second region, and split both the word lines and bit lines in a third region. Lastly, the dimensions of the trenches (depth, cross sectional area, diameter, etc.) may be varied but in practice are a tradeoff of capacitance required, processing convenience, substrate area occupied, and so forth. Of course, the capacitance required depends upon the refresh time, transistor leakage current, supply voltage, soft error immunity, capacitor leakage current, etc.

The capacitor insulator can be of any convenient material, such as oxide, nitride, oxide-nitride, oxide-nitride-oxide, and other stack combinations of these and other insulators; and the ozide could be thermally grown in a variety of ambients, LPCVD of plasma deposited, and so forth. The thickness of the insulator is a tradeoff of capacitance required, breakdown voltage, insulator reliability, process convenience, and so forth and may vary widely. Of course, if the cells and array are fabricated in semiconductor material other than silicon (such as gallium arsenide, aluminum gallium arsenide, mercury cadmium telluride, germanium, indium phosphide, and so forth), then the capacitor insulator will be corresponding material. Further, recrystalized amorphous silicon could be used in place of polysilicon, and the recrystallization may be by energy beam or annealing.

The transistor can be formed to operate with a variety of threshold voltages by adjusting the threshold voltage (such as by a shallow diffusion or ion implantation after the polysilicon channel is deposited but before the protective nitride is deposited in the first preferred embodiment), and the transistor may be fabricated as a p-channel or n-channel device and operate either in the inversion mode or the accumulation mode. The doping levels and doping species can be varied so as to vary the transistor characteristics; and the thin channel of the polysilicon transistor of the first embodiment can be fully depleted to limit the leakage current. Note that the channel length and channel width may be widely varied, with the width roughly determined by the cell spacing.

Of course, the cells may be used in a variety of arrays, not just the preferred embodiment arrays described.

The advantages of the cells, arrays of cells, and methods of fabrication include the small substrate area occupied per cell, the somewhat standard processing techniques used, the isolation from the substrate for the stored charge and transistor channel (except for bulk channel cells), and flexibility of cell characteristics. These advantages translate into a dense packing of cells, noise and alpha particle immunity, economical processing flows, and so forth.

We claim:

1. A memory cell comprising:
   a substrate having a trench formed therein;
   an insulating layer formed on one sidewall of said trench;
   a semiconductive layer formed on said insulating layer, said semiconductive layer including a drain region, a source region, and a channel region disposed between said source and drain regions;
   a gate adjacent to said insulating layer in the region of said insulating layer adjacent to said channel region; and
   a heavily doped region formed in said substrate adjacent to said the portion of said insulating layer which is adjacent to said source region, said heavily doped region having a conductivity type opposite that of said substrate.

2. The cell of claim 1 wherein said heavily doped region is maintained at a fixed electric potential.

3. A device including two memory cells comprising:
   a substrate having a trench formed therein;
   an first insulating layer formed on a first sidewall of said trench;
   a first semiconductive layer formed on said first insulating layer, said semiconductive layer including a drain region, a source region, and a channel region disposed between said source and drain regions;
   a first gate adjacent to said first insulating layer in the region of said first insulating layer adjacent to said channel region of said first semiconductive layer;
   an second insulating layer formed on a second sidewall of said trench;
   a second semiconductive layer formed on said second insulating layer, said semiconductive layer including a drain region, a source region, and a channel region disposed between said source and drain regions;
   a second gate adjacent to said second insulating layer in the region of said second insulating layer adjacent to said channel region of said second semiconductive layer.

4. The cell of claim 3 further comprising a heavily doped region formed in said substrate adjacent to said the portion of said insulating layers which are adjacent to said source regions, said heavily doped region having a conductivity type opposite that of said substrate.

5. The cell of claim 4 wherein said heavily doped region is maintained at a fixed electric potential.

6. A memory array comprising:
   a first plurality of parallel conductors formed on the surface of a substrate;
   a second plurality of parallel conductors formed on the said surface of said substrate perpendicular to said first plurality of parallel conductors;
   a plurality of memory cells formed at the intersections of said conductors, each cell comprising:
   a trench formed in said substrate;

an insulating layer formed on one sidewall of said trench;

a semiconductive layer formed on said insulating layer, said semiconductive layer including a drain region conductively connected to one of said first plurality of conductors, a source region, and a channel region disposed between said source and drain regions;

a gate conductively connected to one of said second conductors adjacent to said insulating layer in the region of said insulating layer adjacent to said channel region.

7. The cell of claim 6 further comprising a heavily doped region formed in said substrate adjacent to said the portion of said insulating layer which is adjacent to said source region, said heavily doped region having a conductivity type opposite that of said substrate.

8. The cell of claim 7 wherein said heavily doped region is maintained at a fixed electric potential.

9. A memory array comprising:
a first plurality of parallel conductors formed on the surface of a substrate;
a second plurality of parallel conductors formed on said surface of said substrate perpendicular to said first plurality of parallel conductors;
a plurality of memory cells formed at the intersections of said conductors, a pair of cells comprising:
a trench formed in said substrate;
a first insulating layer formed on a first sidewall of said trench;
a first semiconductive layer formed on said first insulating layer, said semiconductive layer including a drain region conductively connected to one of said first plurality of parallel conductors, a source region, and a channel region disposed between said source and drain regions;
a first gate adjacent to said first insulating layer in the region of said first insulating layer adjacent to said channel region of said first semiconductive layer, said first gate connected to a first one of said second plurality of parallel conductors;
an second insulating layer formed on a second sidewall of said trench;
a second semiconductive layer formed on said second insulating layer, said semiconductive layer including a drain region conductively connected to one of said first plurality of parallel conductors, a source region, and a channel region disposed between said source and drain regions;
a second gate adjacent to said second insulating layer in the region of said second insulating layer adjacent to said channel region of said semiconductive layer, said second gate connected to a second one of said second plurality of parallel conductors.

10. The cell of claim 9 further comprising a heavily doped region formed in said substrate adjacent to said the portion of said insulating layers which are adjacent to said source regions, said heavily doped region having a conductivity type opposite that of said substrate.

11. The cell of claim 10 wherein said heavily doped region is maintained at a fixed electric potential.

* * * * *